(12) United States Patent
Murasato et al.

(10) Patent No.: US 11,426,906 B2
(45) Date of Patent: Aug. 30, 2022

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventors: Naoki Murasato, Utsunomiya (JP); Ken Minoda, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 578 days.

(21) Appl. No.: 16/413,488

(22) Filed: May 15, 2019

(65) Prior Publication Data

US 2019/0263031 A1 Aug. 29, 2019

Related U.S. Application Data

(63) Continuation of application No. PCT/JP2017/041703, filed on Nov. 20, 2017.

(30) Foreign Application Priority Data

Nov. 22, 2016 (JP) .............................. JP2016-227173

(51) Int. Cl.
*B29C 43/56* (2006.01)
*G03F 7/00* (2006.01)
(Continued)

(52) U.S. Cl.
CPC .............. *B29C 43/56* (2013.01); *B29C 59/02* (2013.01); *G03F 7/0002* (2013.01); *G03F 7/002* (2013.01);
(Continued)

(58) Field of Classification Search
CPC .............. B29C 2043/562; B29C 43/56; B29C 2043/566
See application file for complete search history.

(56) References Cited

U.S. PATENT DOCUMENTS

| 8,672,663 B2 * | 3/2014 | Tanabe | B82Y 40/00 425/210 |
| 2016/0031151 A1 * | 2/2016 | Tan | B82Y 10/00 264/40.5 |

(Continued)

FOREIGN PATENT DOCUMENTS

| JP | 2010-280845 A | 12/2010 |
| JP | 2010-287829 A | 12/2010 |

(Continued)

OTHER PUBLICATIONS

Yamada JP2013251560 2013 English Translation (Year: 2013).*
Aritsuka JP2014056854A 2014 English Translation (Year: 2014).*

*Primary Examiner* — Jacob T Minskey
*Assistant Examiner* — Adrien J Bernard
(74) *Attorney, Agent, or Firm* — Canon U.S.A., Inc. IP Division

(57) ABSTRACT

An imprint apparatus cures an imprint material by irradiating the imprint material with light while the imprint material on a substrate is in contact with a pattern region of a mold. The imprint apparatus includes a first supply unit configured to supply a first gas to a gap between the substrate and the mold, the first gas accelerating filling of recessed portions of the pattern region with the imprint material, and a second supply unit configured to supply a second gas to the gap, the second gas inhibiting curing of the imprint material.

14 Claims, 17 Drawing Sheets

(51) Int. Cl.
　　　*G03F 9/00*　　　　(2006.01)
　　　*B29C 59/02*　　　(2006.01)
　　　*H01L 21/027*　　(2006.01)

(52) U.S. Cl.
　　　CPC .............. *G03F 9/00* (2013.01); *H01L 21/027*
　　　　　　　(2013.01); *B29C 2043/566* (2013.01)

(56) References Cited

U.S. PATENT DOCUMENTS

2016/0257062 A1\*　9/2016　Ishikawa ............... G03F 7/0002
2016/0297116 A1　10/2016　Toyoshima

FOREIGN PATENT DOCUMENTS

| JP | 2011-18722 A | | 1/2011 | | |
|---|---|---|---|---|---|
| JP | 2012-80015 A | | 4/2012 | | |
| JP | 2013-70004 A | | 4/2013 | | |
| JP | 2013-251462 A | | 12/2013 | | |
| JP | 2013-251560 A | | 12/2013 | | |
| JP | 2013251560 A | \* | 12/2013 | ............. | B29C 59/02 |
| JP | 2014-56854 A | | 3/2014 | | |
| JP | 2014-58151 A | | 4/2014 | | |
| JP | 2016-058735 A | | 4/2016 | | |
| JP | 2016-92198 A | | 5/2016 | | |
| JP | 2016-111201 A | | 6/2016 | | |

\* cited by examiner

IMPRINT APPARATUS, IMPRINT METHOD, AND ARTICLE MANUFACTURING METHOD

CROSS-REFERENCE TO RELATED APPLICATIONS

This application is a Continuation of International Patent Application No. PCT/JP2017/041703, filed Nov. 20, 2017, which claims the benefit of Japanese Patent Application No. 2016-227173, filed Nov. 22, 2016, both of which are hereby incorporated by reference herein in their entirety.

TECHNICAL FIELD

The present invention relates to an imprint apparatus, an imprint method, and an article manufacturing method.

BACKGROUND ART

Imprint apparatuses have attracted attention. The imprint apparatus brings an imprint material on a substrate and a mold into contact, cures the imprint material by irradiating the imprint material with light, and thereby transfers a pattern of the mold to the imprint material. In the imprint apparatus, recessed portions of the pattern of the mold are filled with the imprint material while the imprint material is in contact with the mold. It takes a relatively long time to complete the filling. To accelerate the filling, it is preferable that the gap between the substrate and the mold be filled with either a permeable gas that permeates through the imprint material and/or the mold, or a condensable gas condensed by contact of the imprint material with the mold.

Japanese Patent Laid-Open No. 2016-111201 describes a technique in which in a pressing step of pressing a mold against an imprint material, a gas containing at least one of a permeable gas and a condensable gas is supplied to a space between a substrate and the mold, whereas in filling and curing steps, other than the pressing step, an inert gas is supplied to the space. In the invention described in Japanese Patent Laid-Open No. 2016-111201, the control described above reduces the amount of use of the permeable or condensable gas and thus contributes to reduced cost.

To ensure, in the imprint apparatus, that the imprint material is irradiated with a target amount of light over the entire shot region (target of pattern formation) where a pattern is to be formed, a portion of the imprint material outside the shot region may also be irradiated with light. In this case, the imprint material may also be cured outside the shot region (target of pattern formation). When imprint processing is performed in air, since oxygen is present outside the target of pattern formation, oxygen may inhibit the curing of the imprint material. However, when the imprint material is to be cured while the gap between the substrate and the mold is filled with a permeable gas and/or a condensable gas, since oxygen is not present in the neighboring region outside the shot region, the imprint material may be cured by being irradiated with light.

SUMMARY OF INVENTION

An aspect of the present invention relates to an imprint apparatus that cures an imprint material by irradiating the imprint material with light while the imprint material on a substrate is in contact with a pattern region of a mold. The imprint apparatus includes a first supply unit configured to supply a first gas to a gap between the substrate and the mold, the first gas accelerating filling of recessed portions of the pattern region with the imprint material; and a second supply unit configured to supply a second gas to the gap, the second gas inhibiting curing of the imprint material.

Further features of the present invention will become apparent from the following description of exemplary embodiments with reference to the attached drawings.

DESCRIPTION OF EMBODIMENTS

Hereinafter, the present invention will be described using exemplary embodiments with reference to the attached drawings.

Figure 1:
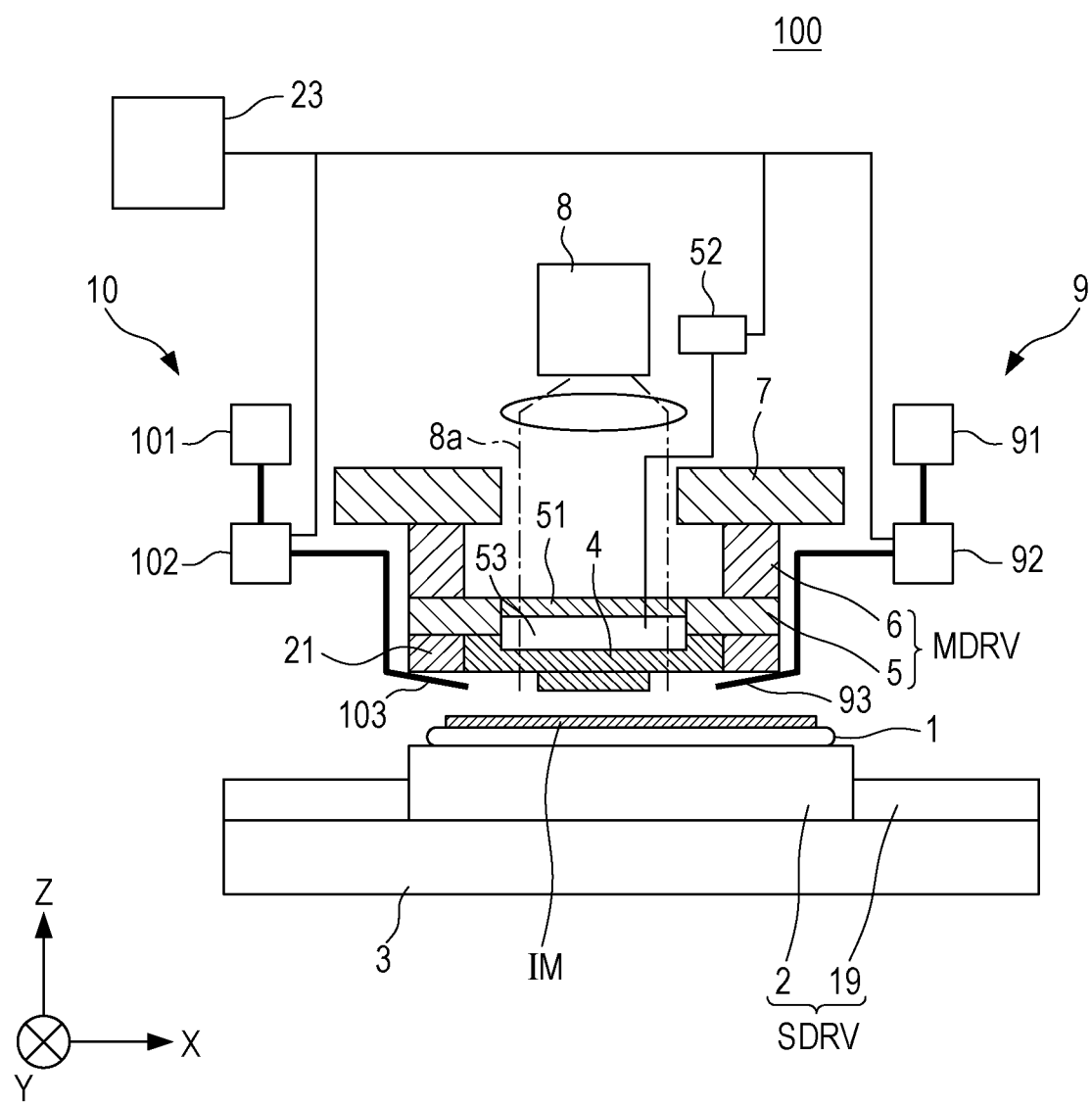
FIG. 1 schematically illustrates a configuration of an imprint apparatus according to a first embodiment of the present invention.
Figure 2:
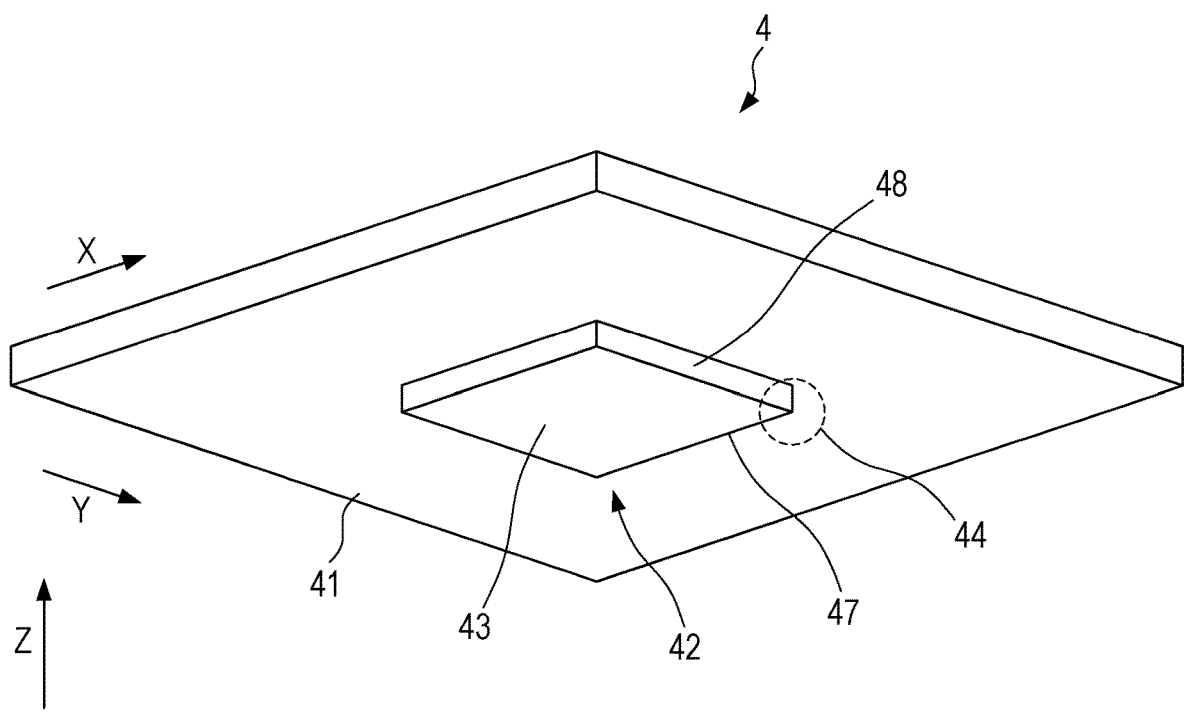
FIG. 2 is a perspective view schematically illustrating a configuration of a mold used in the imprint apparatus according to the first embodiment of the present invention.

FIG. 1 schematically illustrates a configuration of an imprint apparatus 100 according to a first embodiment of the present invention. FIG. 2 is a perspective view schematically illustrating a configuration of a mold 4 used in the imprint apparatus 100. The mold 4 has a base portion 41 and a mesa portion 42 protruding from the base portion 41 and having a rectangular parallelepiped shape. The mesa portion 42 has a pattern region 43. The pattern region 43 has a pattern of raised and recessed portions.

The imprint apparatus 100 cures an imprint material IM by irradiating the imprint material IM with light while the imprint material IM on a substrate 1 is in contact with the pattern region 43 of the mold 4, and thereby produces a cured product of the imprint material IM. Thus, a pattern of the cured product to which the pattern of the pattern region 43 of the mold 4 is transferred is formed on the substrate 1.

As the imprint material IM, a curable composition (which may also be referred to as uncured resin) cured by light irradiation is used. Light may be one that is selected from a wavelength range of 10 nm to 1 mm, such as infrared light, visible light, or ultraviolet light.

The curable composition is a composition cured by light irradiation or heating. A photo-curable composition cured by light contains at least a polymerizable compound and a photoinitiator, and may further contain a non-polymerizable compound or a solvent as necessary. The non-polymerizable compound is of at least one type selected from groups of, for example, sensitizing agents, hydrogen donors, internal mold release agents, surface-active agents, antioxidants, and polymer components.

The imprint material IM is applied by a spin coater or a slit coater onto the substrate 1 in the form of a film. Alternatively, the imprint material IM may be applied by a liquid ejection head onto the substrate 1 in the form of droplets or in the form of islands or film formed by a plurality of droplets joined together. The viscosity of the imprint material IM (viscosity at 25° C.) is, for example, greater than or equal to 1 mPa·s and less than or equal to 100 mPa·s.

The substrate 1 is made of, for example, glass, ceramic, metal, semiconductor, or resin. As necessary, a component made of a material different from that of the substrate 1 may be formed on the surface of the substrate 1. Examples of the substrate 1 include a silicon wafer, a compound semiconductor wafer, and a quartz glass substrate.

In this example, the substrate 1 with a plurality of shot regions having the imprint material IM applied thereon may be supplied to the imprint apparatus 100 as a substrate to be processed. Alternatively, the imprint apparatus 100 may include an imprint material supply unit that supplies the imprint material IM onto one or more shot regions of the substrate 1. The imprint apparatus 100 includes a light irradiation unit (curing unit) 8 that irradiates, with light 8a, the imprint material IM between the shot regions of the substrate 1 and the mold 4 so as to cure the imprint material IM.

The imprint apparatus 100 repeats an imprint cycle to form a pattern on the plurality of shot regions of the substrate 1. One imprint cycle may include a contact step, a filling step, and a curing step. The contact step involves bringing the imprint material IM on the shot regions and the mold 4 into contact. The filling step involves waiting for the recessed portions of the pattern region 43 of the mold 4 to be filled with the imprint material IM. The curing step involves curing the imprint material IM between the shot regions and the pattern region 43.

In the present specification and the attached drawings, directions are defined in an XYZ coordinate system where directions parallel to the surface of the substrate 1 are contained in an XY plane. A direction parallel to the X-axis, a direction parallel to the Y-axis, and a direction parallel to the Z-axis in the XYZ coordinate system are an X-direction, a Y-direction, and a Z-direction, respectively, and rotation about the X-axis, rotation about the Y-axis, and rotation about the Z-axis are θX, θY, and θZ, respectively. Control or drive with respect to the X-axis, Y-axis, and Z-axis refers to control or drive with respect to a direction parallel to the X-axis, a direction parallel to the Y-axis, and a direction parallel to the Z-axis. Control or drive with respect to the θX-axis, θY-axis, and θZ-axis refers to control or drive with respect to rotation about an axis parallel to the X-axis, rotation about an axis parallel to the Y-axis, and rotation about an axis parallel to the Z-axis. Positions refer to information that can be identified on the basis of coordinates on the X-axis, Y-axis, Z-axis, and attitudes refer to information that can be identified by values on the θX-axis, θY-axis, and θZ-axis. Positioning refers to controlling the position and/or attitude. Alignment may involve controlling the position and/or attitude of at least one of the substrate 1 and the mold 4.

The imprint apparatus 100 may include a substrate driving mechanism SDRV that holds and drives the substrate 1, a base frame 3 that supports the substrate driving mechanism SDRV, a mold driving mechanism MDRV that holds and drives the mold 4, and a structure 7 that supports the mold driving mechanism MDRV. The substrate driving mechanism SDRV and the mold driving mechanism MDRV form a driving mechanism that drives at least one of the substrate 1 and the mold 4 so as to adjust the relative position of the substrate 1 and the mold 4. The adjustment of the relative position performed by the driving mechanism involves driving for bringing the mold 4 into contact with the imprint material IM on the substrate 1, and driving for separating the mold 4 from the cured imprint material IM (or pattern of the cured product).

The substrate driving mechanism SDRV may be configured to drive the substrate 1 with respect to a plurality of axes (e.g., three axes: X-axis, Y-axis, and θZ-axis). The substrate driving mechanism SDRV may include, for example, a substrate chuck (substrate stage) 2 that holds the substrate 1, and an actuator 19 that drives the substrate chuck 2. The mold driving mechanism MDRV may be configured to drive the mold 4 with respect to a plurality of axes (e.g., six axes: X-axis, Y-axis, Z-axis, θX-axis, θY-axis, and θZ-axis).

The mold driving mechanism MDRV may include, for example, a mold chuck 5 that holds the mold 4, and an actuator 6 that drives the mold chuck 5. The mold chuck 5 may have a partition member 51 for forming a pressure regulation space 53 on the back side of the base portion 41 (i.e., on the surface opposite the surface having the mesa portion 42 thereon). The partition member 51 may be formed by a light transmissive member that allows the light 8a to pass therethrough. The pressure in the pressure regulation space 53 on the back side of the mold 4 is regulated by a pressure regulator 52. This enables the base portion 41 of the mold 4 (i.e., the upper surface of the base portion 41) to deform and bulge toward the substrate 1 and also to resume its original shape. Typically, when the mold 4 is brought into contact with the imprint material IM on the substrate 1, the mold 4 may be deformed to allow the base portion 41 to bulge downward.

The imprint apparatus 100 may include a mold deforming mechanism 21 that deforms the mold 4 by applying force to the periphery of the mold 4 (pattern region 43). The mold deforming mechanism 21 may be configured to deform the mold 4 by applying force, for example, to the periphery of the base portion 41 of the mold 4. Applying force to the periphery of the base portion 41 causes the base portion 41 to deform, and this allows the pattern region 43 to deform accordingly.

The imprint apparatus 100 includes a first supply unit 9 that supplies a first gas to a gap between the substrate 1 and the mold 4, and a second supply unit 10 that supplies a second gas to the gap. The first gas accelerates filling of the recessed portions of the pattern region 43 of the mold 4 with the imprint material IM, and the second gas inhibits curing of the imprint material IM. The imprint apparatus 100 may include a control unit 23 that controls the supply of the first gas from the first supply unit 9 and the supply of the second gas from the second supply unit 10. The control unit 23 may be configured to also control, for example, the substrate driving mechanism SDRV, the mold driving mechanism MDRV, and the light irradiation unit 8. The control unit 23 may be formed, for example, by a programmable logic device (abbreviated as PLD) such as a field-programmable gate array (abbreviated as FPGA), an application-specific integrated circuit (abbreviated as ASIC), a general-purpose computer having built-in programs, or a combination of some or all of them.

The first supply unit 9 includes a first supply source 91 that holds the first gas, a first nozzle 93 that ejects the first gas, and a first controller 92 in a flow path that connects the first supply source 91 to the first nozzle 93. The first supply source 91 may be disposed outside the imprint apparatus 100. The first controller 92 may include, for example, an on-off valve or a flow control valve. The first gas may be a gas having at least either permeability that allows the gas to permeate through the imprint material IM and/or the mold 4, or condensability that allows the gas to condense under pressure applied thereto by contact of the mold 4 with the imprint material IM. The first gas may contain, for example, at least one of helium and pentafluoropropane (PFP).

The second supply unit 10 includes a second supply source 101 that holds the second gas, a second nozzle 103 that ejects the second gas, and a second controller 102 in a flow path that connects the second supply source 101 to the second nozzle 103. The second supply source 101 may be disposed outside the imprint apparatus 100. The second controller 102 may include, for example, an on-off valve or a flow control valve. The second gas is a gas that inhibits curing of the imprint material IM by light irradiation. For example, the second gas is a gas that contains oxygen.

As described above, the imprint material IM contains at least a polymerizable compound and a photoinitiator. The imprint material IM is cured by polymerization reaction of the polymerizable compound caused by free radicals produced by the photoinitiator irradiated with light. Oxygen reacts with the free radicals produced by the photoinitiator under light irradiation and dissipates the free radicals. This inhibits the polymerization reaction of the polymerizable compound. This means that the curing of the imprint material IM is inhibited. Therefore, by supplying, as the second gas, a gas containing oxygen to the gap between the substrate 1 and the mold 4 (base portion 41) while the pattern region 43 of the mold 4 is in contact with the imprint material IM on the substrate 1, curing of the imprint material IM is inhibited (suppressed) outside the pattern region 43.

The first supply unit 9 may supply the first gas to the gap between the substrate 1 and the mold 4 while the substrate 1 and the mold 4 are moving relative to each other, with the imprint material IM not in contact with the pattern region 43 of the mold 4. The second supply unit 10 may supply the second gas around the pattern region 43 of the mold 4 in the gap between the substrate 1 and the mold 4, with the imprint material IM in contact with the pattern region 43 of the mold 4. The second supply unit 10 may start to supply the second gas around the pattern region 43 when the pressure regulator 52 deforms the base portion 41 of the mold 4 to allow the base portion 41 to bulge toward the substrate 1 and the pattern region 43 is in contact with the imprint material IM. When the base portion 41 of the mold 4 deforms to bulge toward the substrate 1, a large gap is formed between the substrate 1 (imprint material IM) and the base portion 41 around the pattern region 43.

Therefore, the operation described above is advantageous for efficient supply of the second gas around the pattern region 43. The control unit 23 may control the first controller 92 and the second controller 102 to enable the first supply unit 9 and the second supply unit 10 to operate as described above. Alternatively, the first controller 92 and the second controller 102 may operate in accordance with the state of the imprint apparatus 100 to enable the first supply unit 9 and the second supply unit 10 to operate as described above.

Figure 3A:
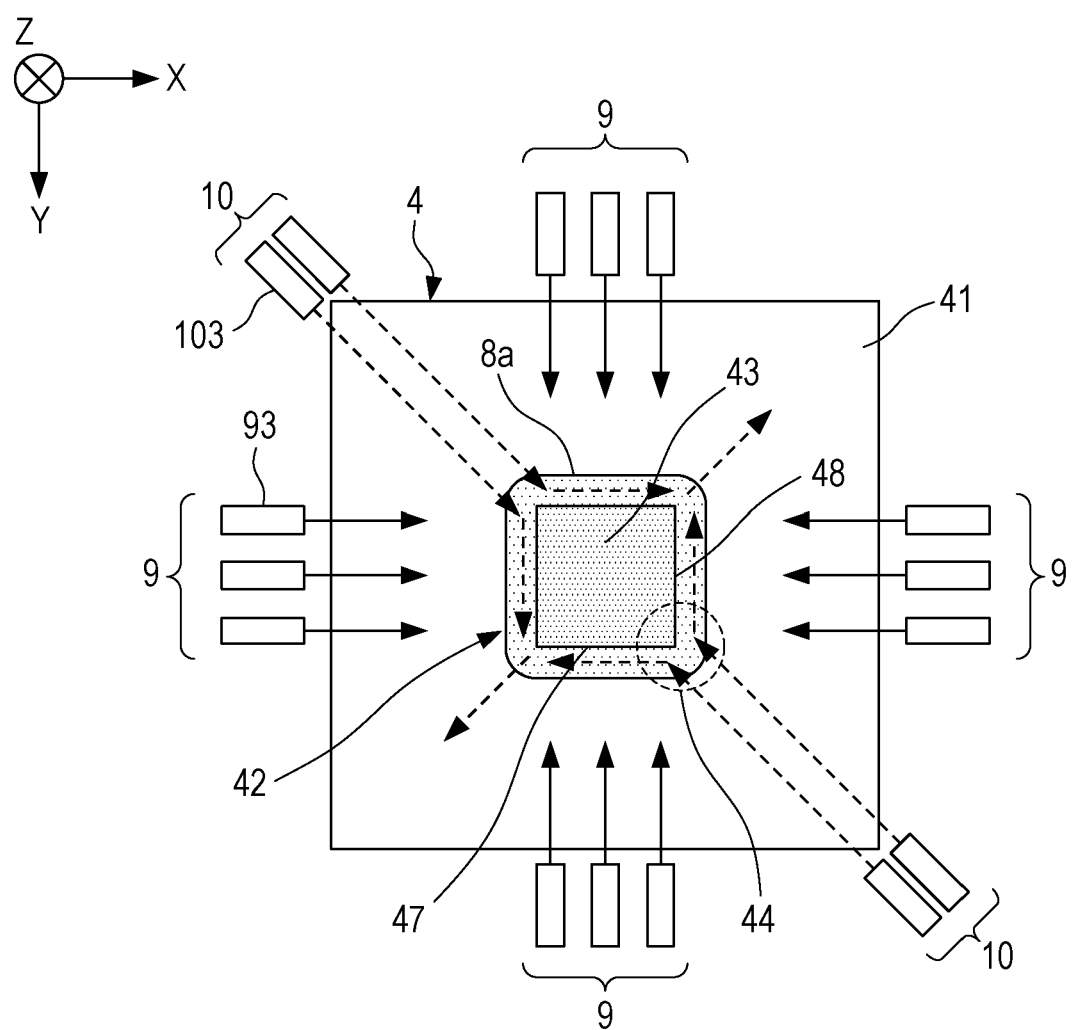
FIG. 3A schematically illustrates a configuration of a first supply unit and a second supply unit in a first configuration example.
Figure 3B:
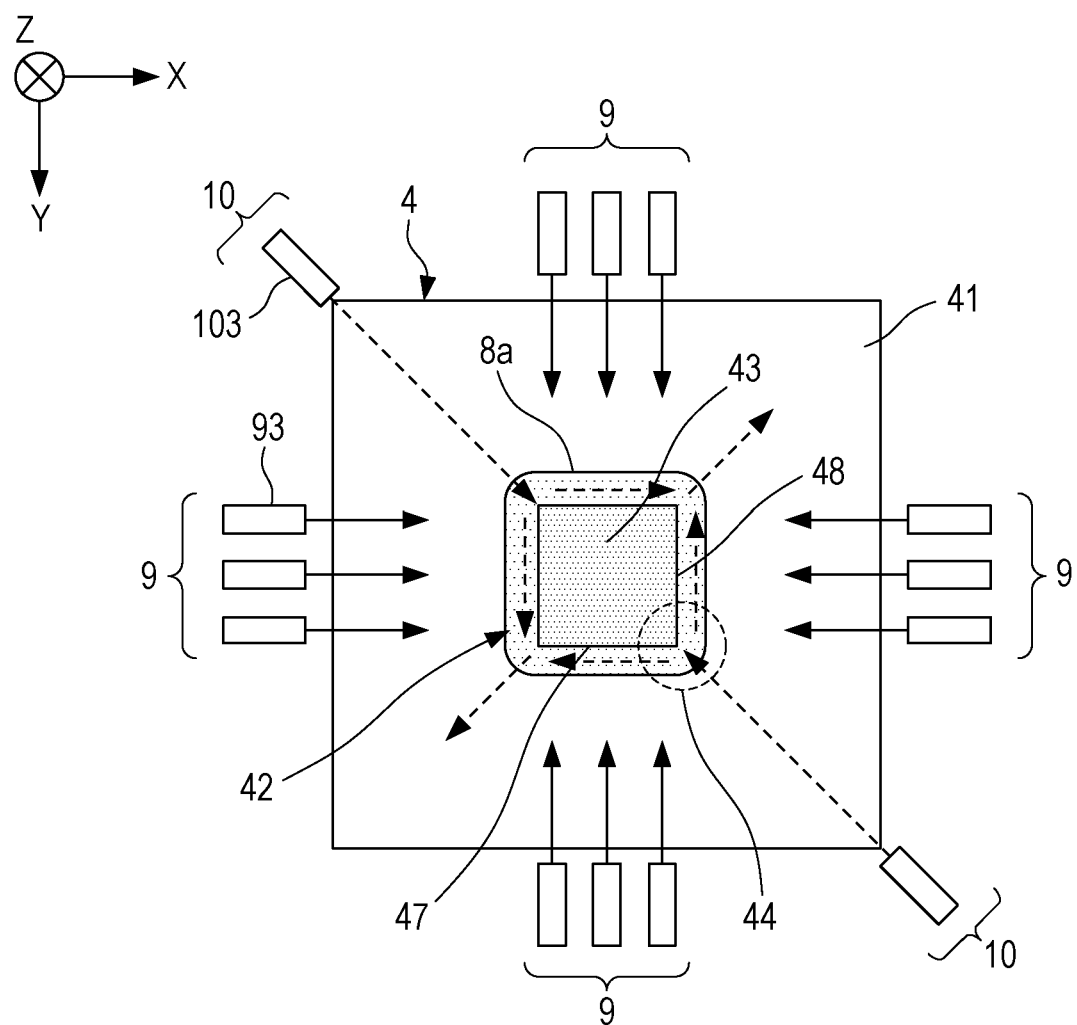
FIG. 3B schematically illustrates a configuration of the first supply unit and the second supply unit in a second configuration example.

FIG. 3A schematically illustrates a configuration of the first supply unit 9 and the second supply unit 10 in a first configuration example. FIG. 3B schematically illustrates a configuration of the first supply unit 9 and the second supply unit 10 in a second configuration example. The first configuration example and the second configuration example differ in the number of second nozzles 103 of the second supply unit 10. The first supply unit 9 includes one or more first nozzles 93 that eject the first gas, and the ejection of the first gas from the one or more first nozzles 93 each is toward a corresponding side of the mesa portion 42. In the examples illustrated in FIGS. 3A and 3B, the first supply unit 9 has a plurality of first nozzles 93 for each side of the mesa portion 42. Alternatively, the first supply unit 9 may have only one first nozzle 93 for each side of the mesa portion 42, or may have only one first nozzle 93 for the mesa portion 42.

The second supply unit 10 includes one or more second nozzle 103 that eject the second gas, and the ejection of the second gas from the one or more second nozzles 103 each is toward a corresponding corner 44 of the mesa portion 42. The one or more second nozzles 103 may each be configured such that the second gas ejected therefrom and hitting the corner 44 flows along two sides 47 and 48 sharing the corner 44. This allows a gas, such as the first gas, around the sides of the mesa portion 42 to be efficiently replaced by the second gas.

The second supply unit 10 includes two sets of second nozzles 103. The two sets of second nozzles 103 may be positioned such that the second gas is ejected toward two diagonally opposite ones of the four corners 44 of the mesa portion 42. Specifically, the second nozzles 103 in the first set may be configured to eject the second gas toward one of the diagonally opposite corners 44, and the second nozzles 103 in the second set may be configured to eject the second gas toward the other of the diagonally opposite corners 44.

In one configuration example, the first supply unit 9 may include one or more first nozzles 93, the second supply unit 10 may include one or more second nozzles 103, and the one or more first nozzles 93 and the one or more second nozzles 103 may be arranged to surround the mold 4. Preferably, the one or more first nozzles 93 and the one or more second nozzles 103 may be arranged near the mold 4 to surround the mold 4. The one or more first nozzles 93 and the one or more second nozzles 103 may be arranged, for example, near the mold deforming mechanism 21. In another example, the discharge opening of each first nozzle 93 may have, for example, a long narrow shape with the same width as that of the pattern region 43, or an annular shape surrounding the mold 4. Each second nozzle 103 may have a long narrow shape.

To uniformly irradiate the pattern region 43 with the light 8a, a region wider than the pattern region 43 may be irradiated with the light 8a. In other words, the pattern region 43 is included in the region irradiated with the light 8a. In the configuration where a region wider than the pattern region 43 is irradiated with the light 8a, the imprint material IM may be cured outside the pattern region 43 if the second gas does not inhibit the curing of the imprint material IM. Therefore, in the present embodiment, for example, after the mold 4 is brought into contact with the imprint material IM and before the imprint material IM is irradiated with the light 8a, the second supply unit 10 supplies the second gas to a gap between the substrate 1 and the mold 4, or more specifically, to the outside of the pattern region 43 in the gap. To prevent inhibition of curing of the imprint material IM in the pattern region 43, the second supply unit 10 preferably starts to supply the second gas after the mold 4 is brought into contact with the imprint material IM.

The first supply unit 9 and the second supply unit 10 may share the nozzles that eject the first gas and the nozzles that eject the second gas.

Next, with reference to FIGS. 4 and 5, a description will be made as to how the first supply unit 9 and the second supply unit 10 supply the first gas and the second gas, respectively. The control unit 23 may control the first controller 92 and the second controller 102 to enable the first supply unit 9 and the second supply unit 10 to operate, or the first controller 92 and the second controller 102 may operate in accordance with the state of the imprint apparatus 100 to enable the first supply unit 9 and the second supply unit 10 to operate.

In FIGS. 4 and 5, numbered rectangles on the substrate 1 represent shot regions, and of the shot regions, a shot region where a pattern is already formed by imprinting (i.e., shot region where the imprint material IM is cured) is shaded. The numbers in the rectangles indicate the order in which the imprinting (curing) is carried out. For example, the shot region with "1" is the first shot region where imprinting is performed first.

Figure 4A:
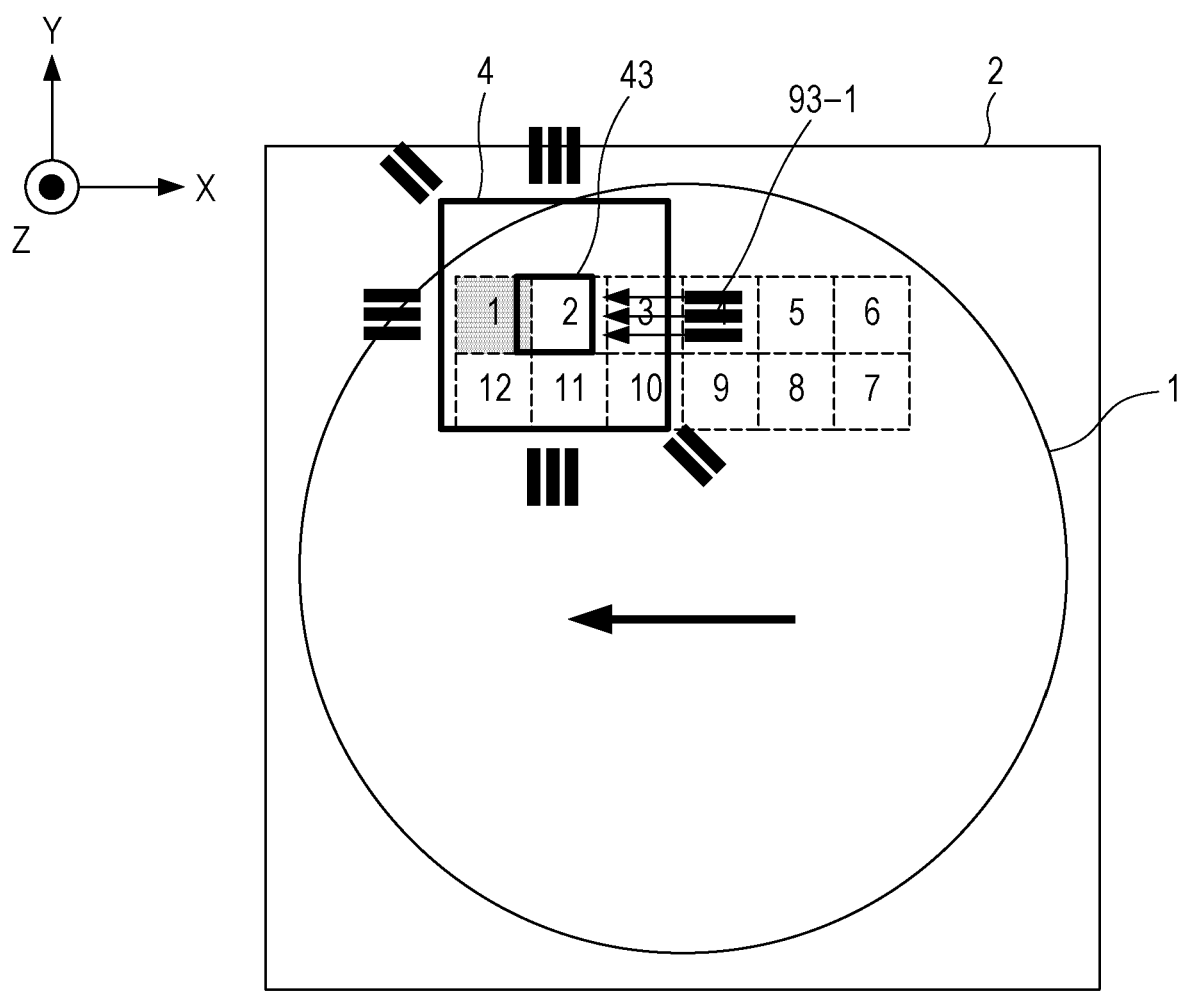
FIG. 4A illustrates how the first supply unit supplies a first gas.

FIG. 4A illustrates the substrate 1 (substrate chuck 2) moving in the negative X-direction after completion of imprinting on the first shot region. By using the movement of the substrate 1 (substrate chuck 2) in the negative X-direction, the first gas is ejected in the negative X-direction from first nozzles 93-1 and supplied under the pattern region 43 of the mold 4. Of the plurality of first nozzles 93, the first nozzles 93-1 are ones that are located in the positive X-direction as viewed from the center of the mold 4.

Figure 4B:
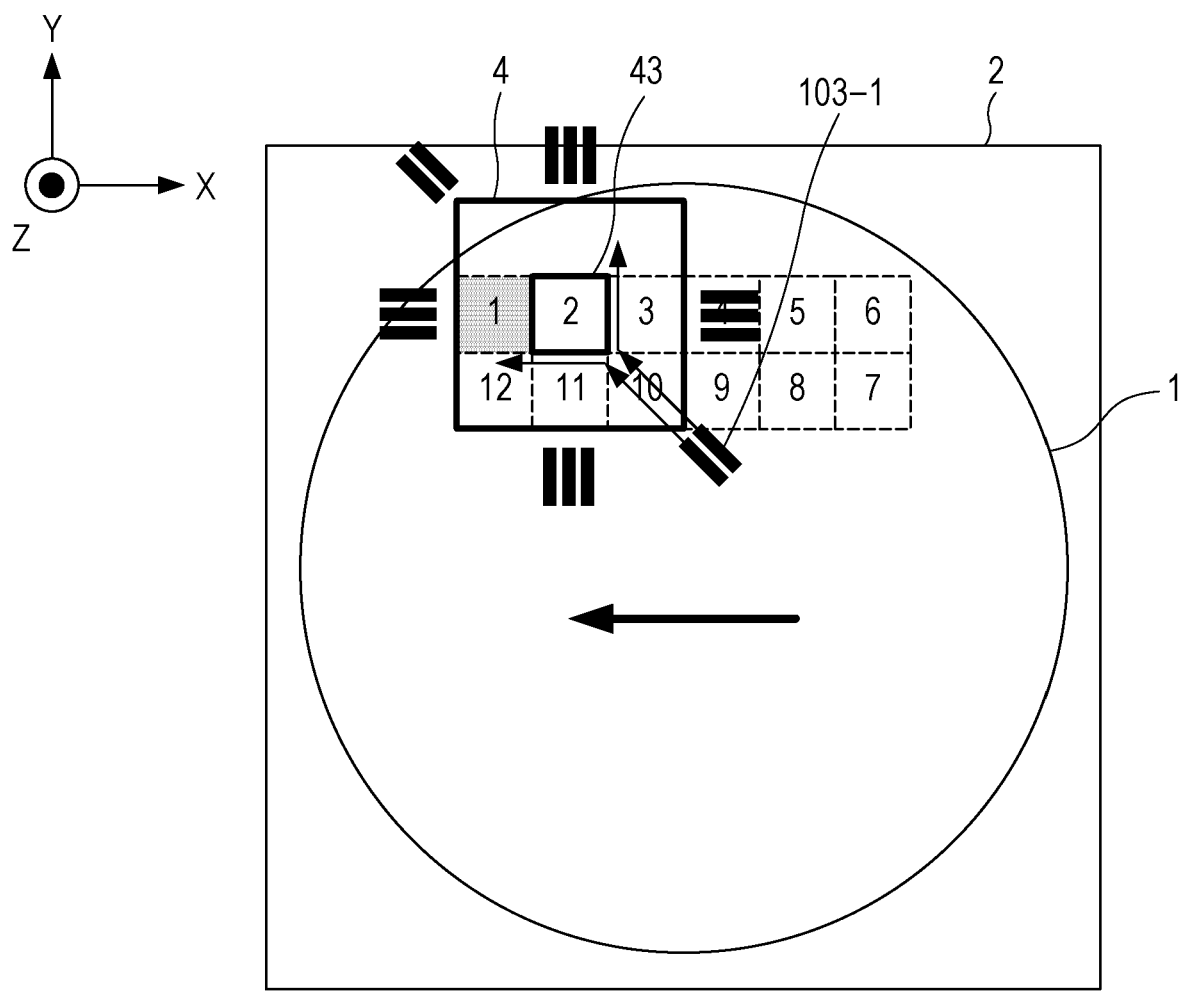
FIG. 4B illustrates how the second supply unit supplies a second gas.

FIG. 4B illustrates the pattern region 43 of the mold 4 in contact with the imprint material IM on the second shot region. During light irradiation of the imprint material IM on the second shot region performed in this state, it is necessary to inhibit curing of the imprint material IM on the third and tenth to twelfth shot regions where imprinting has not yet been performed. Therefore, to supply the second gas over the third and tenth to twelfth shot regions, the second gas is ejected from second nozzles 103-1. Of the plurality of second nozzles 103, the second nozzles 103-1 are ones from which the second gas can be easily supplied to the third and tenth to twelfth shot regions. Then, the imprint material IM on the second shot region is irradiated with light, so that the imprint material IM is cured.

Figure 5A:
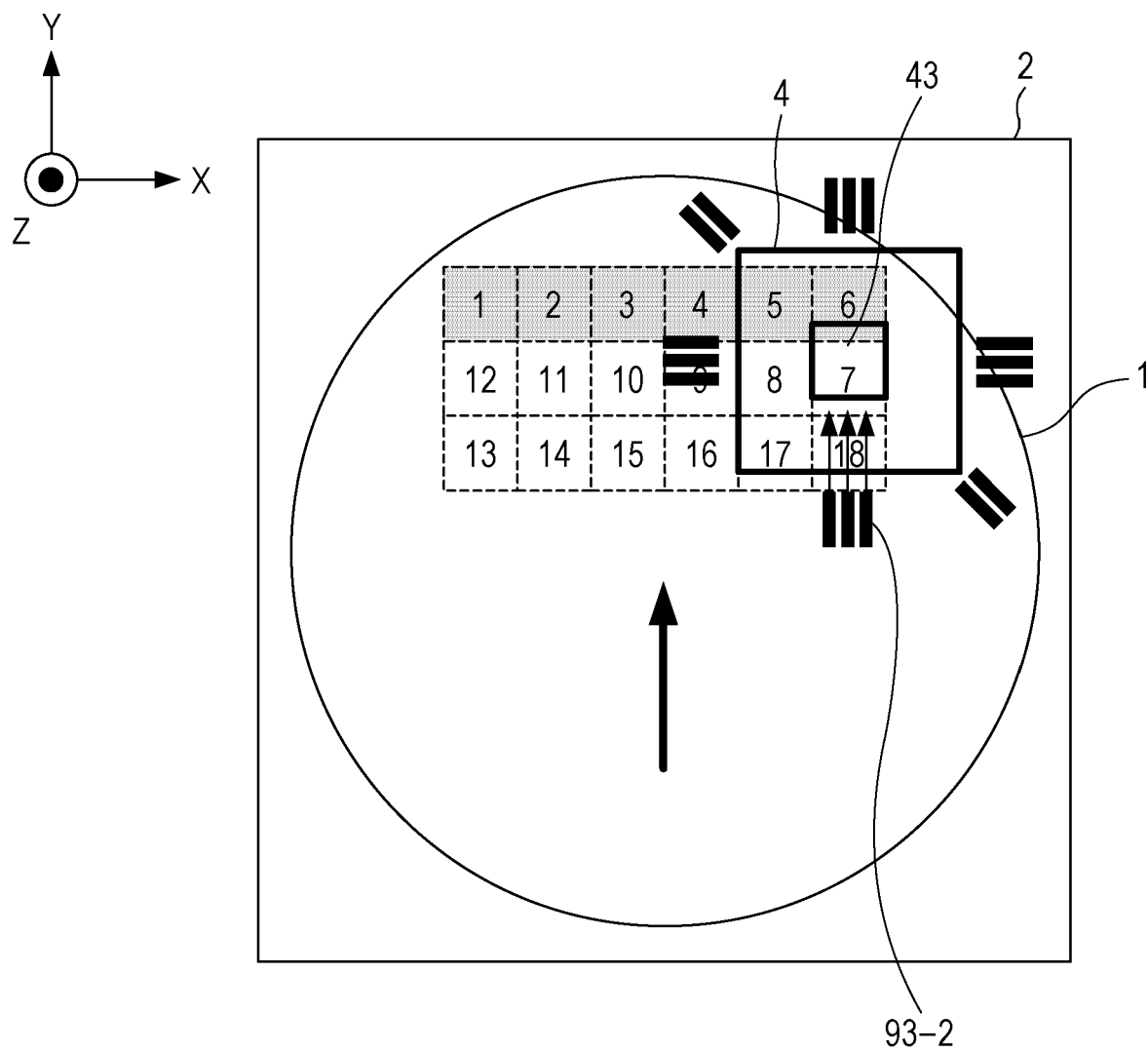
FIG. 5A illustrates how the first supply unit supplies the first gas.

FIG. 5A illustrates the substrate 1 (substrate chuck 2) moving in the positive Y-direction after completion of imprinting on the sixth shot region. By using the movement of the substrate 1 (substrate chuck 2) in the positive Y-direction, the first gas is ejected in the positive Y-direction from first nozzles 93-2 and supplied under the pattern region 43 of the mold 4. Of the plurality of first nozzles 93, the first nozzles 93-2 are ones that are located in the negative Y-direction as viewed from the center of the mold 4.

Figure 5B:
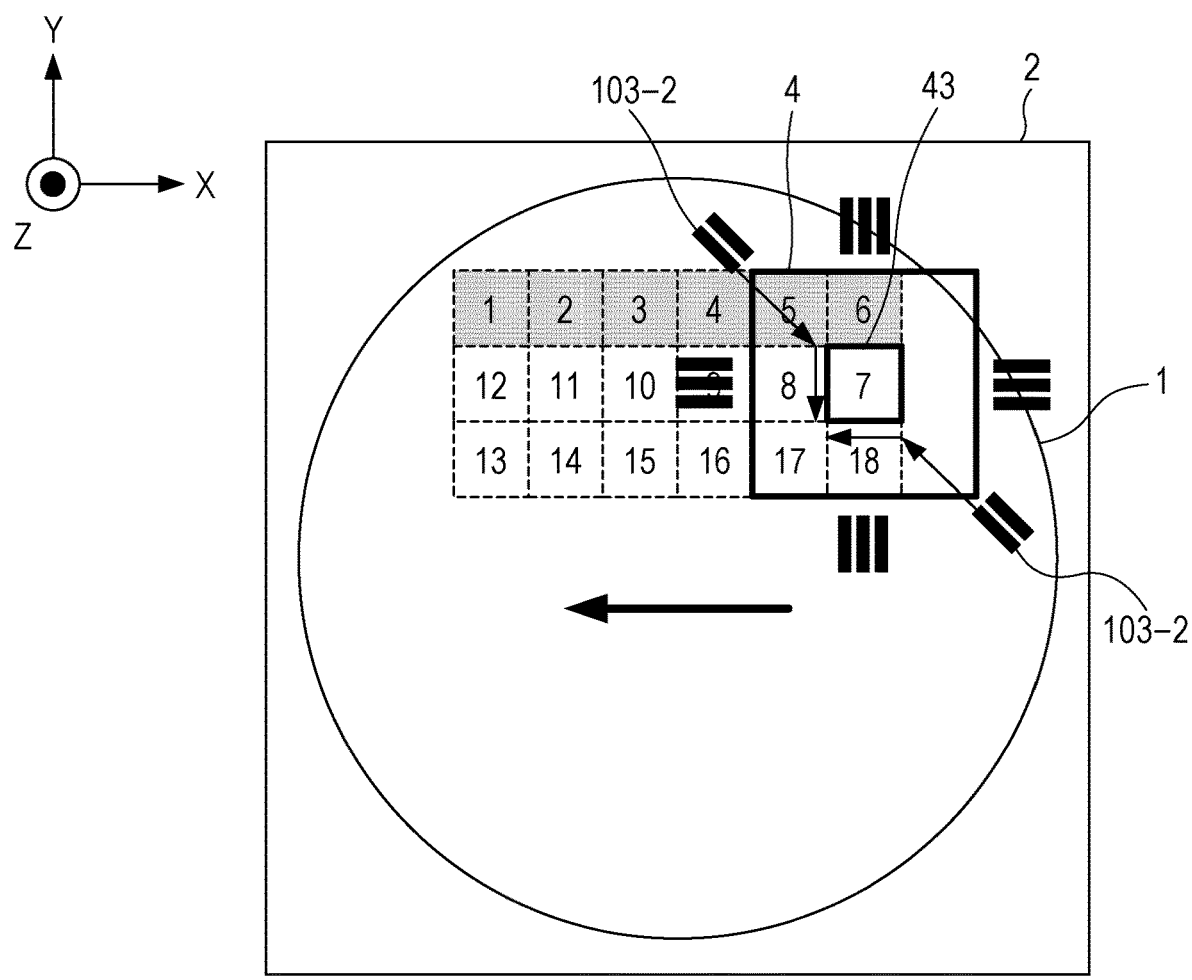
FIG. 5B illustrates how the second supply unit supplies the second gas.

FIG. 5B illustrates the pattern region 43 of the mold 4 in contact with the imprint material IM on the seventh shot region. During light irradiation of the imprint material IM on the seventh shot region performed in this state, it is necessary to inhibit curing of the imprint material IM on the eighth, seventeenth, and eighteenth shot regions where imprinting has not yet been performed. Therefore, to supply the second gas over the eighth, seventeenth, and eighteenth shot regions, the second gas is ejected from second nozzles 103-2. Of the plurality of second nozzles 103, the second nozzles 103-2 are ones from which the second gas can be easily supplied to the eighth, seventeenth, and eighteenth shot regions. Then, the imprint material IM on the seventh shot region is irradiated with light, so that the imprint material IM is cured.

As described above, of the plurality of first nozzles 93 and the plurality of second nozzles 103, a first nozzle from which the first gas is to be ejected and a second nozzle from which the second gas is to be ejected may be selected in accordance with which shot region of the substrate 1 is to be subjected to imprinting.

Figure 6:
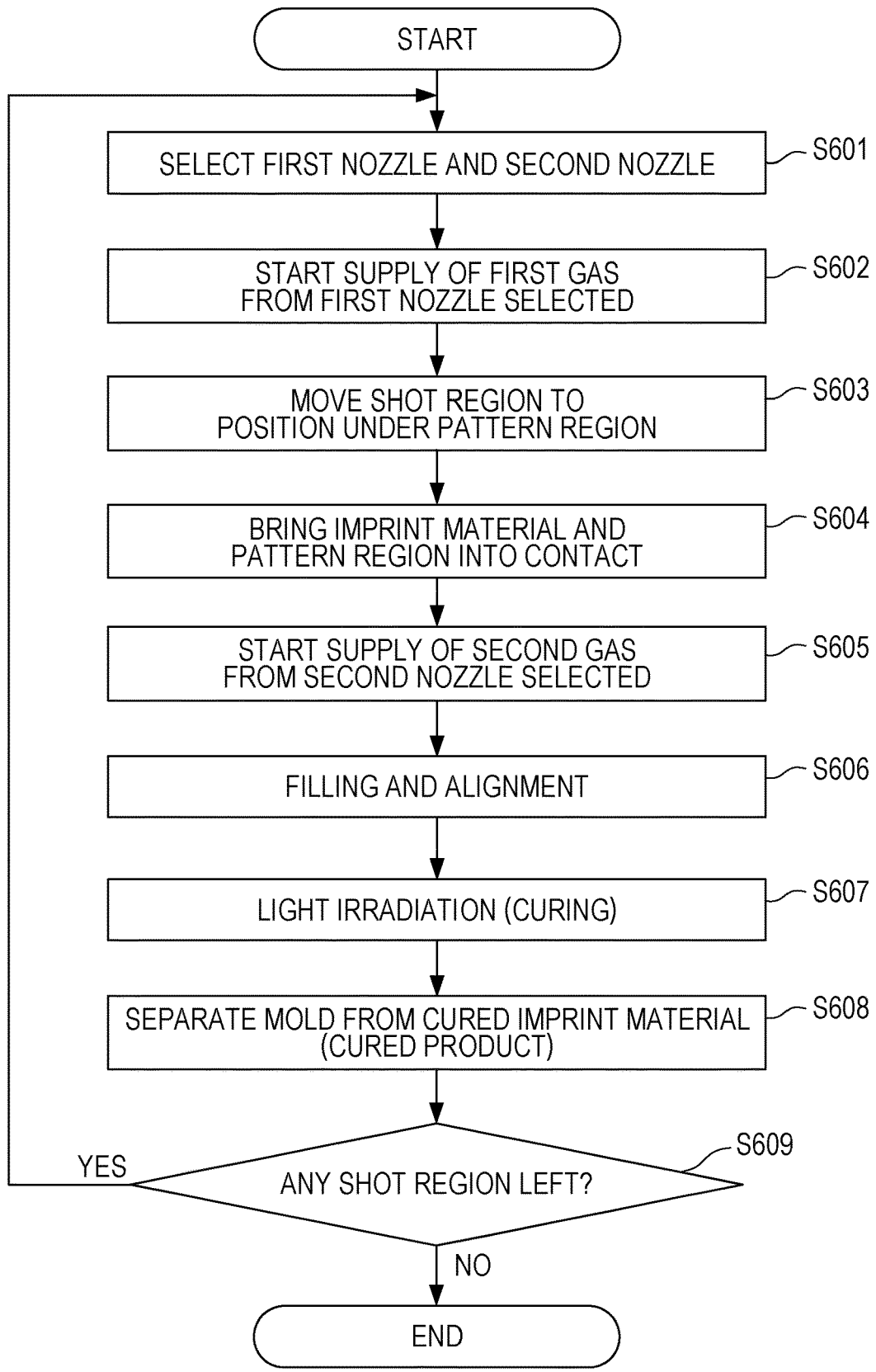
FIG. 6 illustrates an imprint sequence performed on a plurality of shot regions of a substrate.

FIG. 6 illustrates an imprint sequence performed on a plurality of shot regions of the substrate 1. This imprint sequence may be controlled by the control unit 23. In step S601, in accordance with which shot region is to be subjected to imprinting, the control unit 23 selects, from the plurality of first nozzles 93 of the first supply unit 9, a first nozzle from which the first gas is to be ejected, and also selects, from the plurality of second nozzles 103 of the second supply unit 10, a second nozzle from which the second gas is to be ejected.

In step S602, the control unit 23 controls the first controller 92 of the first supply unit 9 such that the first gas is ejected from the first nozzle 93 selected in step S601. In step S603, the control unit 23 controls the substrate driving mechanism SDRV such that the shot region to be subjected to imprinting is moved to a position under the pattern region 43 of the mold 4. In step S604, the control unit 23 controls the mold driving mechanism MDRV to bring the imprint material IM and the pattern region 43 of the mold 4 into contact. At this point, the control unit 23 may cause the pressure regulator 52 to deform the mold 4 such that the base portion 41 of the mold 4 bulges downward.

In step S605, the control unit 23 controls the second controller 102 of the second supply unit 10 such that the second gas is ejected from the second nozzle 103 selected in step S601. It is preferable here that the second supply unit 10 start to supply the second gas, with the mold 4 in contact with the imprint material IM, while the mold 4 is deformed by the pressure regulator 52 to allow the base portion 41 of the mold 4 to bulge downward. Since there is a large gap between the base portion 41 and the substrate 1 (imprint material IM) in this state, the first gas around the pattern region 43 can be easily replaced by the second gas. While not shown, the control unit 23 typically terminates the ejection of the first gas from the first nozzle 93 before start of ejection of the second gas from the second nozzle 103.

In step S606, while waiting for the recessed portions of the pattern region 43 to be filled with the imprint material IM, the control unit 23 controls the alignment of the mold 4 and the shot region to be subjected to imprinting. The alignment may be done by detecting, by means of an alignment scope (not shown), the relative position of the mark of the shot region to be subjected to imprinting and the mark of the mold 4, and adjusting the relative position of the substrate 1 and the mold 4 such that the detected relative position coincides with a target relative position. The relative position may be adjusted under control by the substrate driving mechanism SDRV and the mold driving mechanism MDRV.

In step S607, the control unit 23 controls the light irradiation unit 8 such that the imprint material IM on the shot region to be subjected to imprinting is irradiated with the light 8*a*. The light irradiation unit 8 includes a light source and a shutter. The light irradiation unit 8 may be configured to control the irradiation of the imprint material IM with the light 8*a* by means of the shutter, or may have a light source that emits light in accordance with an instruction from the control unit 23. By irradiating, with the light 8*a*, the imprint material IM on the shot region to be subjected to imprinting, the imprint material IM on the shot region is cured. The presence of the second gas around the pattern region 43 (i.e., in a region where curing should be avoided) inhibits the curing of the imprint material IM around the pattern region 43.

In step S608, the control unit 23 controls the mold driving mechanism MDRV to separate the mold 4 from the cured imprint material IM (cured product). In step S609, the control unit 23 determines whether there is any shot region left unprocessed. If there is a shot region left unprocessed, the control unit 23 determines that the shot region is to be subjected to imprinting, and then returns to step S601. On the other hand, if there is no shot region left unprocessed, the control unit 23 terminates the imprint sequence illustrated in FIG. 6.

Figure 7:
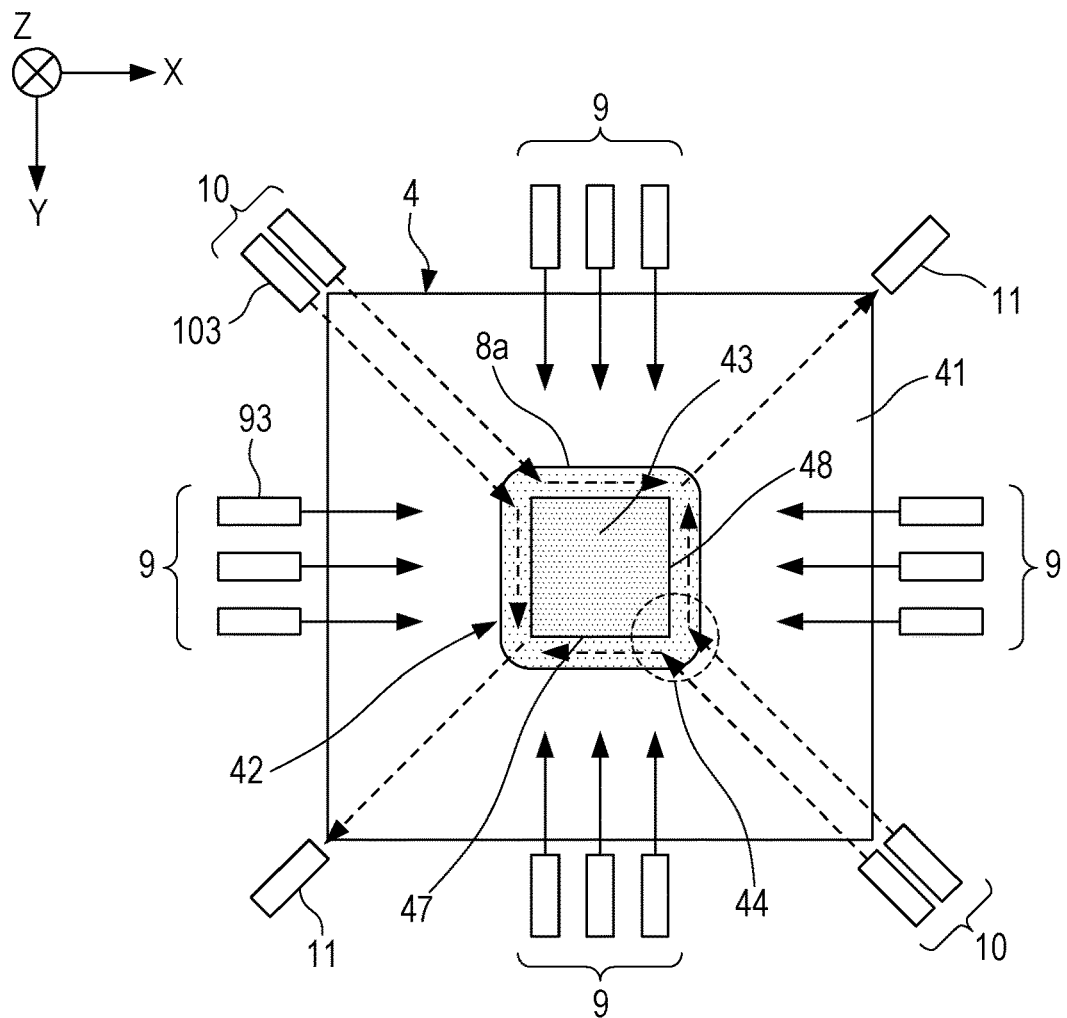
FIG. 7 illustrates a modified imprint apparatus.

As illustrated in FIG. 7, the imprint apparatus 100 may further include suction nozzles 11 that draw in gasses, such as the first gas and the second gas. The suction nozzles 11 may be arranged around the mold 4 in proximity thereto. The suction nozzles 11 may be arranged, for example, on a diagonal line connecting the corners adjacent to the corners 44 to which the second nozzles 103 of the second supply unit 10 are directed. The suction nozzles 11 enable the first gas around the pattern region 43 to be quickly removed and allow the second gas to be supplied around the pattern region 43.

Figure 8A:
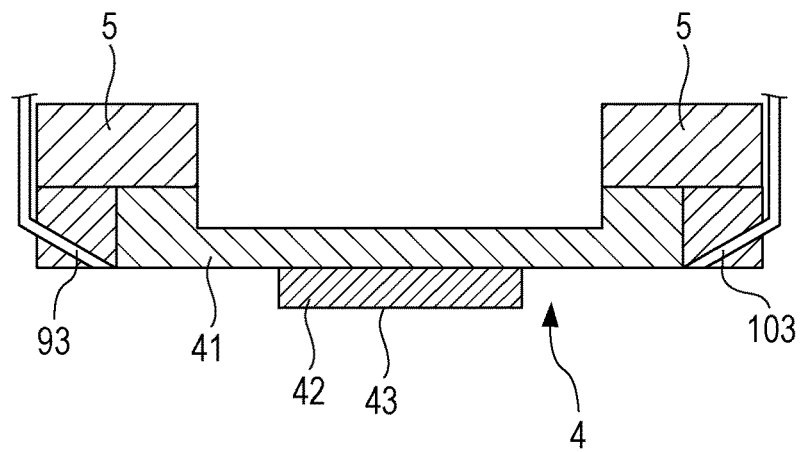
FIG. 8A is a diagram illustrating how a mold chuck, a mold deforming mechanism, the first supply unit, the second supply unit, and the mold are positioned relative to one another.
Figure 8B:
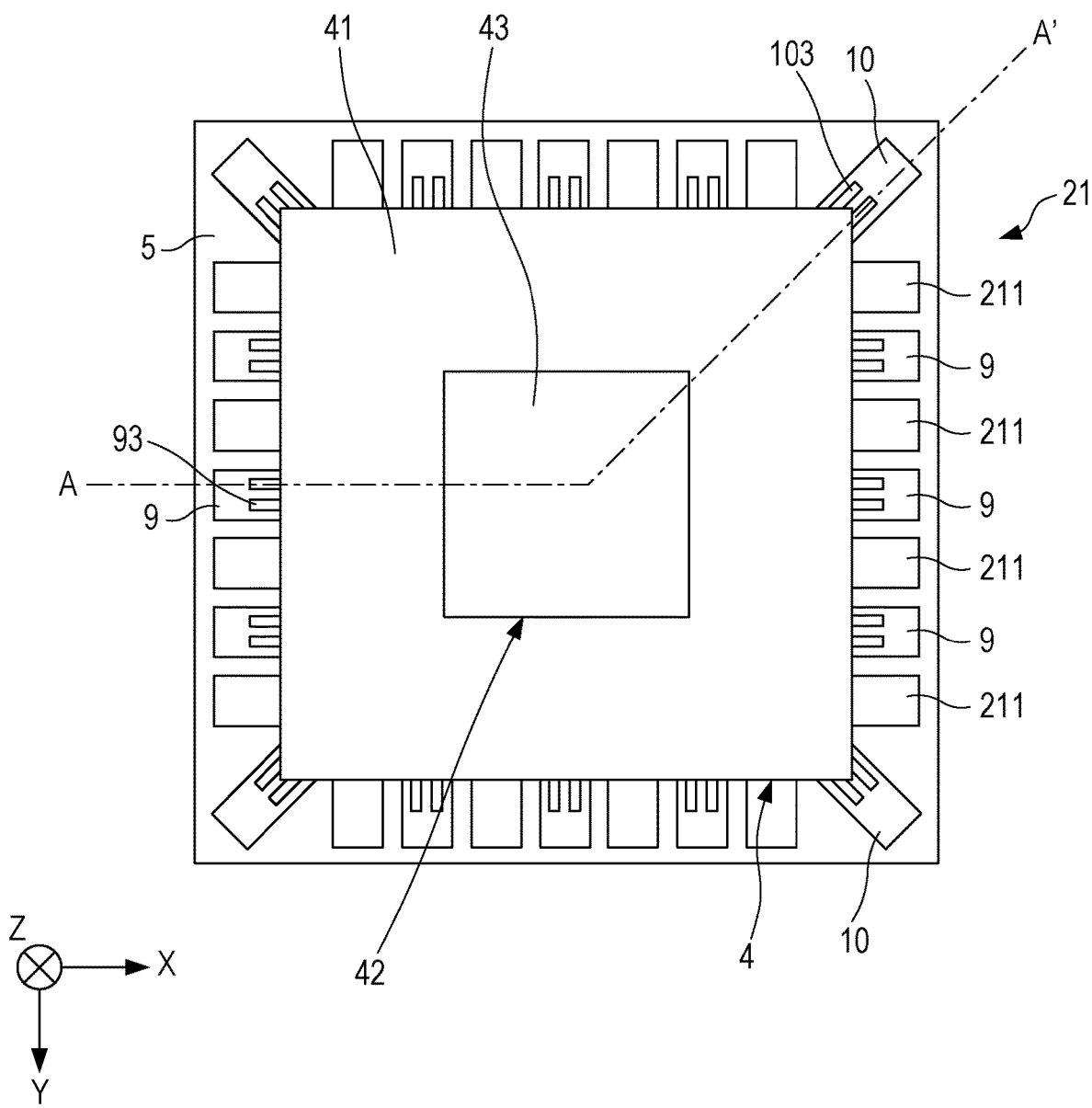
FIG. 8B is another diagram illustrating how the mold chuck, the mold deforming mechanism, the first supply unit, the second supply unit, and the mold are positioned relative to one another.

FIG. 8 illustrates how the mold chuck 5, the mold deforming mechanism 21, the first supply unit 9, the second supply unit 10, and the mold 4 are positioned relative to one another. FIG. 8B is a bottom view of the mold chuck 5, the mold deforming mechanism 21, the first supply unit 9, the second supply unit 10, and the mold 4, and FIG. 8A is a cross-sectional view taken along line VIIIA-VIIIA of FIG. 8B. The mold deforming mechanism 21 includes a plurality of actuators 211. The plurality of actuators 211 may be arranged to surround the periphery of the base portion 41 of the mold 4. The first supply unit 9 includes a plurality of first nozzles 93, and the second supply unit 10 includes a plurality of second nozzles 103. The plurality of first nozzles 93 and the plurality of second nozzles 103 may be arranged to surround the periphery of the base portion 41 of the mold 4. The first nozzles 93 may each be disposed between two adjacent ones of the actuators 211.

Figure 9:
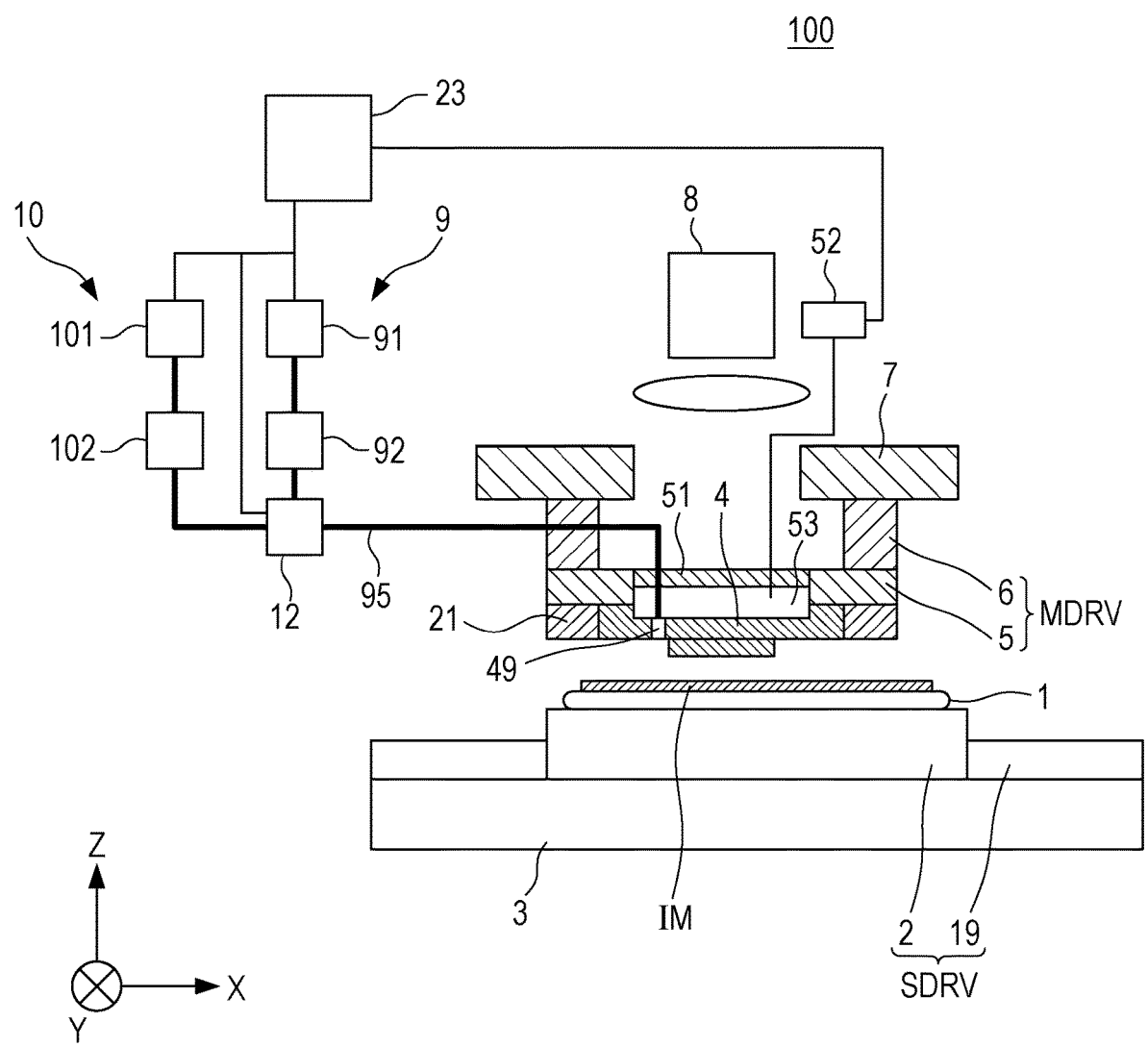
FIG. 9 schematically illustrates a configuration of an imprint apparatus according to a second embodiment of the present invention.
Figure 10:
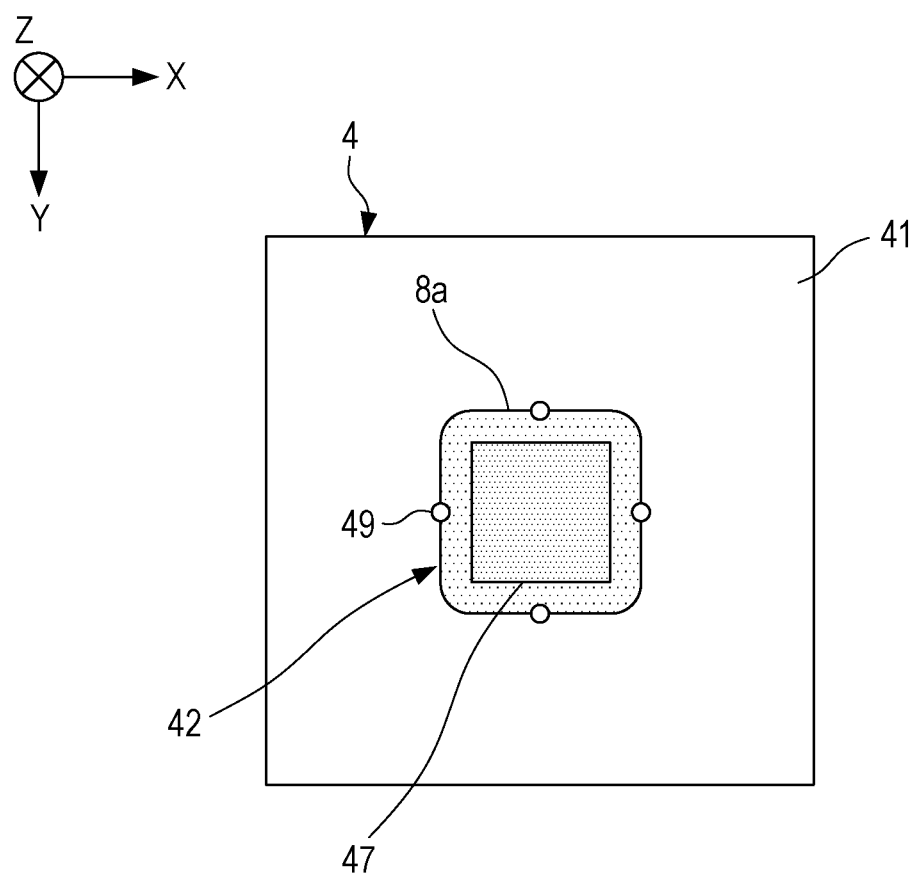
FIG. 10 schematically illustrates a configuration of a mold that can be used in the imprint apparatus according to the second embodiment of the present invention.

FIG. 9 schematically illustrates a configuration of the imprint apparatus 100 according to a second embodiment of the present invention. FIG. 10 schematically illustrates a configuration of the mold 4 that can be used in the imprint apparatus 100 according to the second embodiment. In the second embodiment, the mold 4 has holes 49, through which the first gas and the second gas are supplied to the gap between the substrate 1 and the mold 4. The first gas or the second gas is selectively supplied to the holes 49. Specifically, either the first gas supplied from the first supply unit 9 or the second gas supplied from the second supply unit 10 is selected by a selector 12, supplied through a connection flow path 95 into the holes 49 in the mold 4, and further supplied to the gap between the substrate 1 and the mold 4.

While the substrate 1 and the mold 4 are moving relative to each other, with the imprint material IM not in contact with the mold 4, the selector 12 selects the first gas from the first and second gasses and supplies the first gas to the gap between the substrate 1 and the mold 4. After the imprint material IM and the mold 4 are brought into contact, the selector 12 selects the second gas from the first and second gasses and supplies the second gas around the pattern region 43 of the mold 4 in the gap between the substrate 1 and the mold 4.

In an alternative configuration, the mold 4 may have a hole for supplying the first gas and a hole for supplying the second gas, so that the first gas and the second gas are supplied through different paths. Other matters not mentioned in the second embodiment may be the same as those in the first embodiment.

Figure 11:
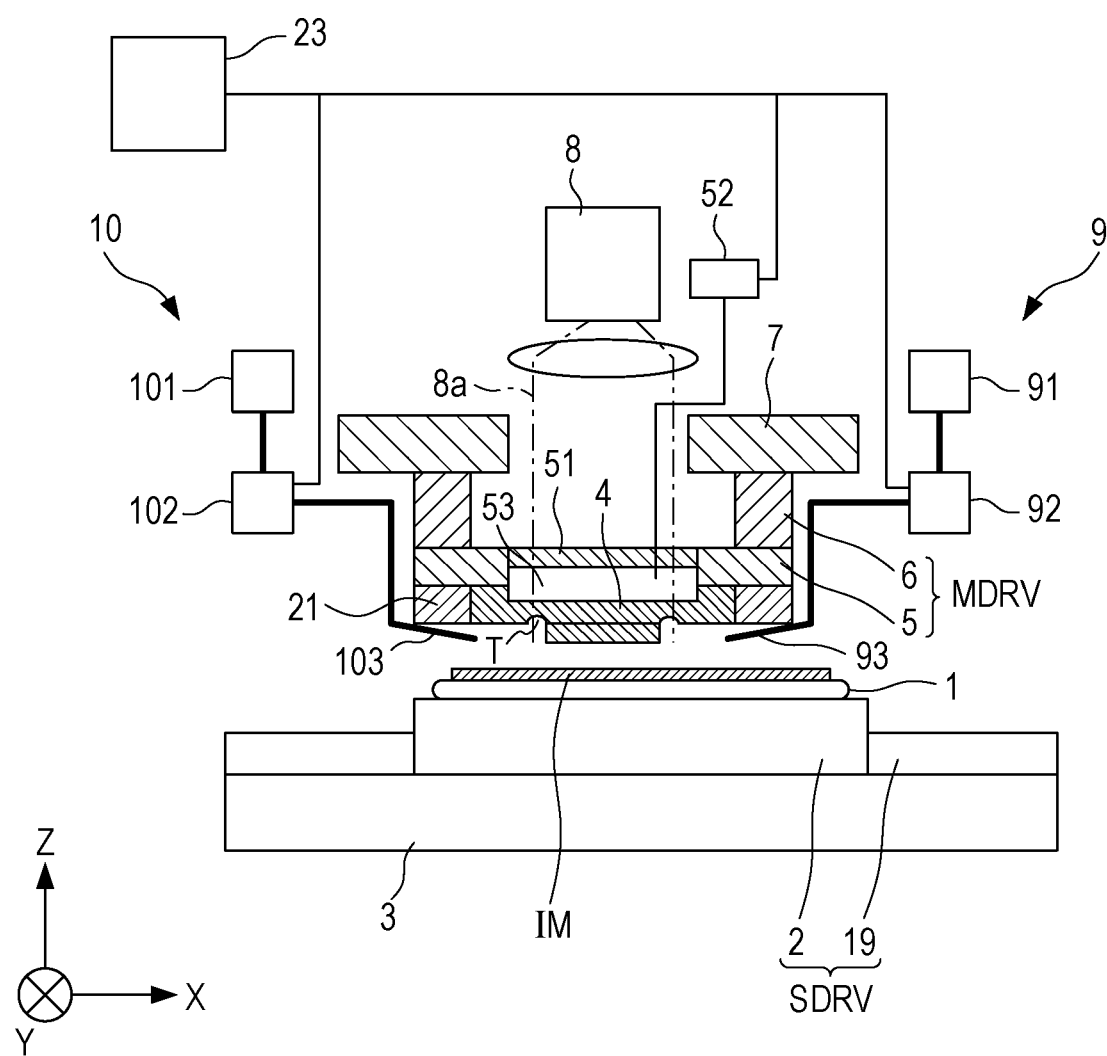
FIG. 11 schematically illustrates a configuration of an imprint apparatus according to a third embodiment of the present invention.
Figure 12:
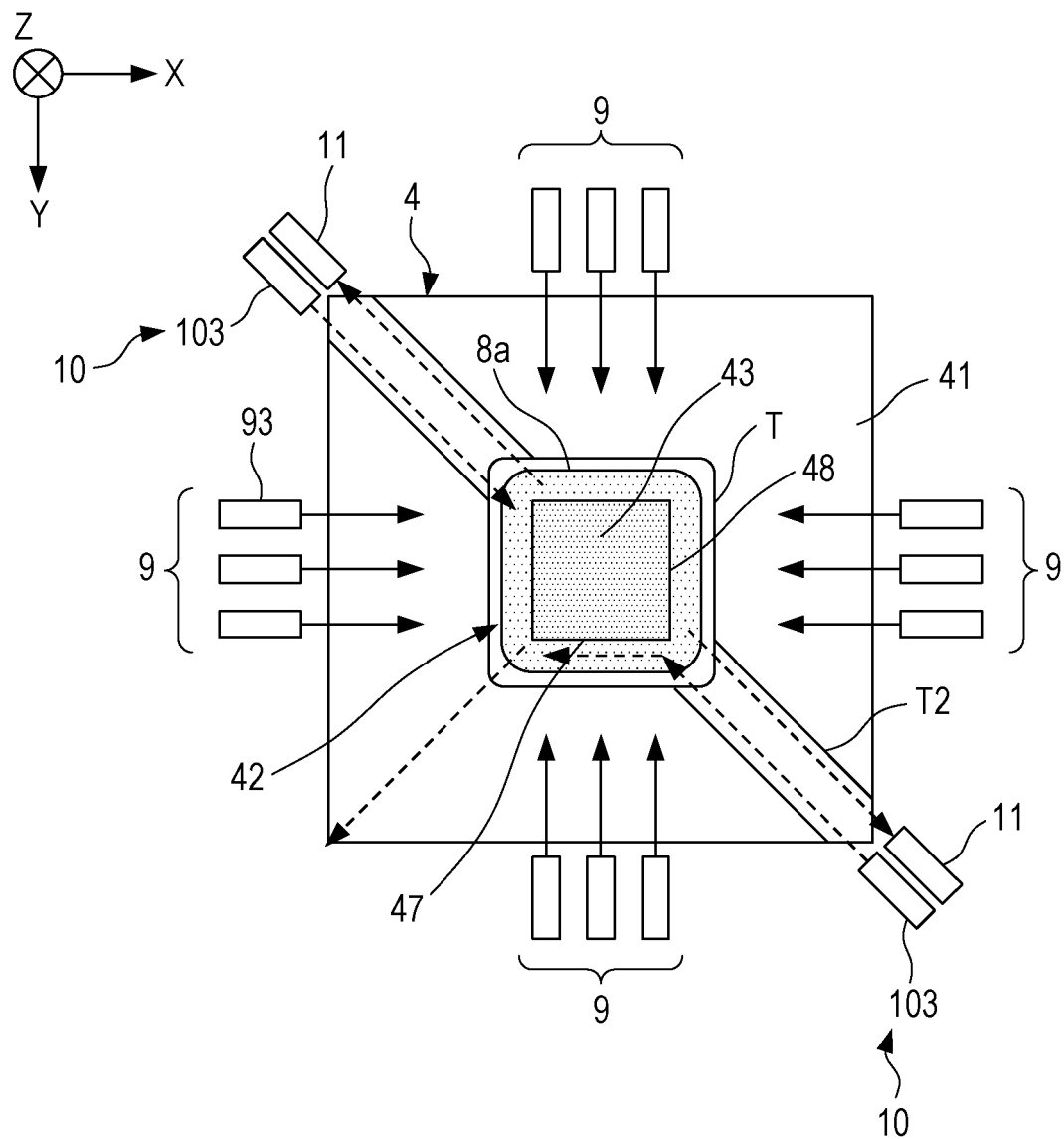
FIG. 12 schematically illustrates a configuration of a mold used in the imprint apparatus according to the third embodiment of the present invention.

FIGS. 11 and 12 schematically illustrate a configuration of the imprint apparatus 100 according to a third embodiment of the present invention, and a configuration of the mold 4 used in the imprint apparatus 100. In the third embodiment, the mold 4 has a groove T around the mesa portion 42. The groove T may function as a flow path that allows the second gas to circulate. The mold 4 may also have a groove T2 that connects the groove T to the edge of the base portion 41. The second nozzles 103 of the second supply unit 10 may be configured to supply the second gas through the groove T2 to the groove T. The imprint apparatus 100 of the third embodiment may include the suction nozzles 11. The suction nozzles 11 can draw in gasses, such as the first gas, from the groove T. Thus, after the pattern region 43 of the mold 4 is brought into contact with the imprint material IM on the substrate 1, the first gas around the pattern region 43 can be quickly replaced by the second gas.

When a gas (e.g., helium) lighter than air or oxygen is used as the first gas, the first gas tends to move upward above the groove T. This means that the first gas can be easily moved away from the imprint material IM. Other matters not mentioned in the third embodiment may be the same as those in the first embodiment.

A pattern of a cured product formed using the imprint apparatus is permanently used as at least part of various types of articles, or is temporarily used to manufacture various types of articles. Examples of the articles include electric circuit elements, optical elements, MEMS, recording elements, sensors, and molds. Examples of the electric circuit elements include volatile or nonvolatile semiconductor memories, such as DRAM, SRAM, flash memory, and MRAM, and semiconductor elements, such as LSI, CCD, image sensor, and FPGA. Examples of the molds include molds for imprinting.

The pattern of the cured product is used, without change, as a component member of at least some of the articles described above, or is temporarily used as a resist mask. The resist mask is removed, for example, after etching or ion implantation in a substrate processing step.

Figure 13A:
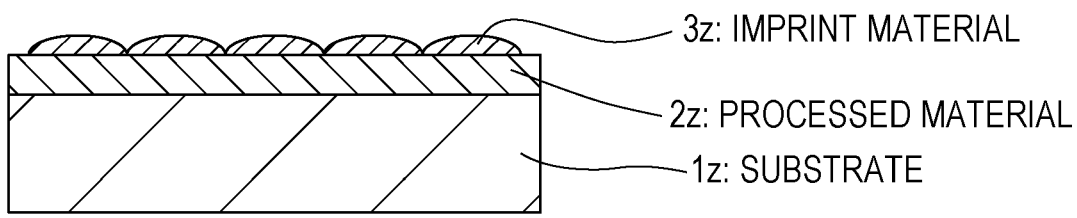
FIG. 13A is a diagram schematically illustrating an article manufacturing method.

An article manufacturing method for manufacturing articles using an imprint apparatus, such as that described above, will now be described. As illustrated in FIG. 13A, a substrate 1z (e.g., silicon wafer) having a processed material 2z (e.g., insulator) formed on the surface thereof is prepared, and then an imprint material 3z is applied onto the surface of the processed material 2z using, for example, an inkjet technique. FIG. 13A illustrates the imprint material 3z applied on the substrate 1z in the form of a plurality of droplets.

Figure 13B:
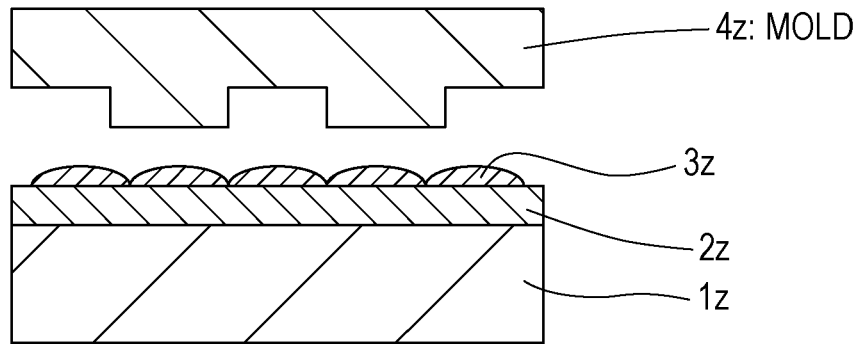
FIG. 13B is another diagram schematically illustrating the article manufacturing method.
Figure 13C:
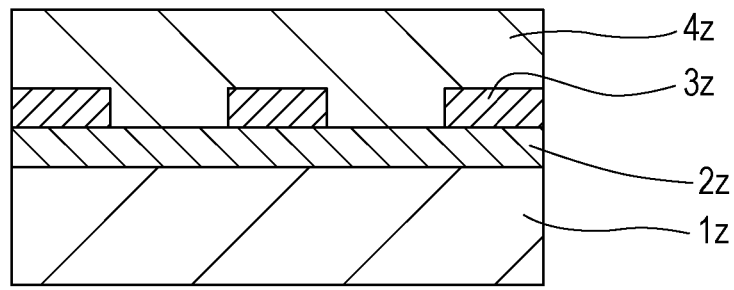
FIG. 13C is another diagram schematically illustrating the article manufacturing method.

As illustrated in FIG. 13B, a mold 4z for imprinting is positioned, with a raised and recessed pattern thereof facing the imprint material 3z on the substrate 1z. As illustrated in FIG. 13C, the substrate 1z having the imprint material 3z applied thereon and the mold 4z are brought into contact and subjected to pressure. The gap between the mold 4z and the processed material 2z is filled with the imprint material 3z. The imprint material 3z is cured by being irradiated through the mold 4z with light, which serves as energy for curing.

Figure 13D:
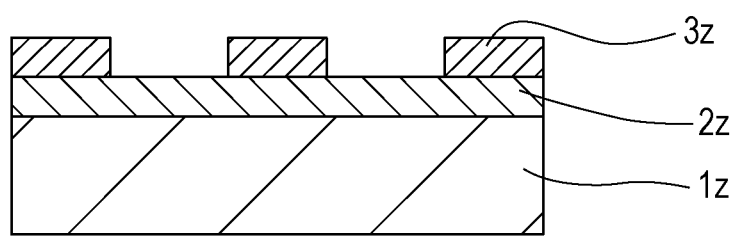
FIG. 13D is another diagram schematically illustrating the article manufacturing method.

As illustrated in FIG. 13D, separating the mold 4z from the substrate 1z after the imprint material 3z is cured forms a pattern of the cured product of the imprint material 3z over the substrate 1z. The pattern of the cured product has a shape in which the raised portions of the cured product correspond to the recessed portions of the mold 4z, and the recessed portions of the cured product correspond to the raised portions of the mold 4z. That is, the raised and recessed pattern of the mold 4z is transferred to the imprint material 3z.

Figure 13E:
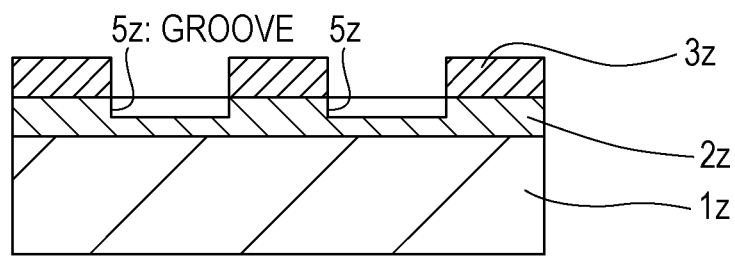
FIG. 13E is another diagram schematically illustrating the article manufacturing method.
Figure 13F:
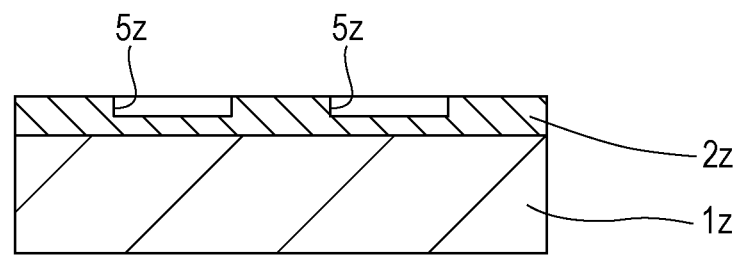
FIG. 13F is another diagram schematically illustrating the article manufacturing method.

As illustrated in FIG. 13E, when etching is performed using the pattern of the cured product as an etching-resistant mask, parts of the surface of the processed material 2z where no or only a thin layer of the cured product remains are removed to form grooves 5z. As illustrated in FIG. 13F, removing the pattern of the cured product can produce an article with the grooves 5z formed in the surface of the processed material 2z. Although the pattern of the cured product is removed here, it may be left unremoved after the processing and may be used, for example, as an interlayer insulating film included in a semiconductor element, that is, as a component member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An imprint apparatus that cures an imprint material by irradiating the imprint material with light while the imprint material on a substrate is in contact with a pattern region of a mold, the imprint apparatus comprising:
   a first supply unit configured to supply a first gas to a gap between the substrate and the mold, the first gas accelerating filling of recessed portions of the pattern region with the imprint material;
   a second supply unit configured to supply a second gas to the gap, the second gas inhibiting curing of the imprint material; and
   a pressure regulator configured to supply pressure to the back side of the mold so as to bulge toward the substrate,
   wherein the first supply unit supplies the first gas to the gap while the substrate and the mold are moving relative to each other with the imprint material not in contact with the pattern region of the mold,
   wherein the second supply unit starts to supply the second gas around the pattern region when the pressure regulator deforms the mold to bulge toward the substrate and the pattern region of the mold is in contact with the imprint material.

2. The imprint apparatus according to claim 1, wherein the mold has a base portion and a mesa portion protruding from the base portion, the mesa portion having a rectangular parallelepiped shape; and
   the pattern region is in the mesa portion, the second supply unit has a nozzle ejecting the second gas, and the ejection of the second gas from the nozzle is toward a corner of the mesa portion.

3. The imprint apparatus according to claim 2, wherein the second gas ejected from the nozzle and hitting the corner flows along two sides sharing the corner.

4. The imprint apparatus according to claim 2, further comprising a mold deforming mechanism configured to deform the mold by applying force to a periphery of the mold, wherein the nozzle is disposed near the mold deforming mechanism.

5. The imprint apparatus according to claim 2, wherein the first supply unit includes a nozzle ejecting the first gas, and the ejection of the first gas from the nozzle is toward a side of the mesa portion.

6. The imprint apparatus according to claim 1, further comprising a mold deforming mechanism configured to deform the mold by applying force to the mold, wherein the first supply unit includes a first nozzle, the second supply unit includes a second nozzle, and the first nozzle and the second nozzle are disposed in the mold deforming mechanism.

7. The imprint apparatus according to claim 1, wherein the first supply unit includes a plurality of first nozzles, and the second supply unit includes a plurality of second nozzles; and
   of the plurality of first nozzles and the plurality of second nozzles, a first nozzle from which the first gas is to be ejected and a second nozzle from which the second gas is to be ejected are selected in accordance with which shot region of the substrate is to be subjected to imprinting.

8. The imprint apparatus according to claim 1, wherein the mold has a hole; and
   the first supply unit supplies the first gas through the hole to the gap, and the second supply unit supplies the second gas through the hole to the gap.

9. The imprint apparatus according to claim 1, wherein the mold has a base portion and a mesa portion protruding from the base portion, the mesa portion having a rectangular parallelepiped shape; the pattern region is in the mesa portion; the base portion has a first groove disposed to surround the mesa portion, and a second groove connecting the first groove to an edge of the base portion; and the second supply unit supplies the second gas through the second groove to the first groove.

10. The imprint apparatus according to claim 1, wherein the mold has a base portion and a mesa portion protruding from the base portion, the mesa portion having a rectangular parallelepiped shape; and the pattern region is in the mesa portion,
    the imprint apparatus further comprising a pressure regulator configured to regulate a pressure applied to a surface of the base portion opposite a surface thereof having the mesa portion thereon, wherein the second supply unit starts to supply the second gas around the pattern region when the pressure regulator deforms the base portion of the mold to allow the base portion to bulge toward the substrate and the pattern region is in contact with the imprint material.

11. The imprint apparatus according to claim 1, wherein the first gas is a gas having at least either permeability that allows the gas to permeate through at least one of the imprint material and the mold, or condensability that allows the gas to condense under pressure applied thereto by contact of the mold with the imprint material; and the second gas is a gas containing oxygen.

12. An imprint method that cures an imprint material by irradiating the imprint material with light while the imprint material on a substrate is in contact with a pattern region of a mold, the imprint method comprising the steps of:

supplying a first gas to a gap between the substrate and the mold, the first gas accelerating filling of recessed portions of the pattern region with the imprint material;

supplying a second gas to the gap, the second gas inhibiting curing of the imprint material, and supplying pressure to the back side of the mold so as to bulge toward the substrate, the step of supplying the first gas supplies the first gas to the gap while the substrate and the mold are moving relative to each other, with the imprint material not in contact with the pattern region of the mold; and the step of supplying the second gas supplies the second gas around the pattern region when the mold is deformed to bulge toward the substrate in the step of supplying pressure and the pattern region of the mold is in contact with the imprint material.

13. An article manufacturing method comprising the steps of:

forming a pattern on a substrate using an imprint apparatus; and processing the substrate having the pattern formed thereon by the step of forming, wherein the imprint apparatus that cures an imprint material by irradiating the imprint material with light while the imprint material on a substrate is in contact with a pattern region of a mold, the imprint apparatus comprising:

a first supply unit configured to supply a first gas to a gap between the substrate and the mold, the first gas accelerating filling of recessed portions of the pattern region with the imprint material;

a second supply unit configured to supply a second gas to the gap, the second gas inhibiting curing of the imprint material; and a pressure regulator configured to supply pressure to the back side of the mold so as to bulge toward the substrate, wherein the first supply unit supplies the first gas to the gap while the substrate and the mold are moving relative to each other with the imprint material not in contact with the patter region of the mold, and wherein the second supply unit starts to supply the second gas around the pattern region when the pressure regulator deforms the mold to bulge toward the substrate and the pattern region of the mold is in contact with the imprint material.

14. The imprint apparatus according to claim 1, wherein the first supply unit terminates to supply of the first gas before the second supply unit starts to supply the second gas.

* * * * *